United States Patent
Winslow (10) Patent No.: US 12,026,152 B1
(45) Date of Patent: Jul. 2, 2024

(54) MAXIMALLY DISTRIBUTED MINIMALLY COORDINATED SYSTEMS AND METHODS

(71) Applicant: Era Software, Inc., Bainbridge Island, WA (US)

(72) Inventor: Robert Winslow, Oakland, CA (US)

(73) Assignee: SERVICENOW DELAWARE LLC, Santa Clara, CA (US)

( * ) Notice: Subject to any disclaimer, the term of this patent is extended or adjusted under 35 U.S.C. 154(b) by 0 days.

(21) Appl. No.: 18/053,735

(22) Filed: Nov. 8, 2022

Related U.S. Application Data (60) Provisional application No. 63/277,150, filed on Nov. 8, 2021, provisional application No. 63/277,128, filed on Nov. 8, 2021.

(51) Int. Cl.
*G06F 16/23* (2019.01)

(52) U.S. Cl.
CPC ...... *G06F 16/2379* (2019.01); *G06F 16/2365* (2019.01)

(58) Field of Classification Search
CPC ............. G06F 16/2365; G06F 16/2379; G06F 16/2343; G06F 11/1474
See application file for complete search history.

(56) References Cited

U.S. PATENT DOCUMENTS

| | | | |
|---|---|---|---|
| 6,438,562 B1 | 8/2002 | Gupta | |
| 6,718,338 B2 | 4/2004 | Vishnubhotla | |
| 7,437,349 B2 | 10/2008 | Basu | |
| 7,743,077 B2 | 6/2010 | Gaurav | |
| 8,380,714 B2 | 2/2013 | Inagaki | |
| 9,122,722 B2 | 9/2015 | Collins | |
| 9,852,377 B1 | 12/2017 | Kumar | |
| 10,127,285 B2 | 11/2018 | Vuppala | |
| 10,402,379 B2 | 9/2019 | Riggs | |
| 10,474,701 B2 | 11/2019 | Ebaugh | |
| 10,853,162 B2 | 12/2020 | Haridas | |
| 10,853,728 B1 | 12/2020 | Walters | |
| 10,956,448 B2 | 3/2021 | Bernhardy | |

(Continued)

OTHER PUBLICATIONS

Kraska, T. et al. (Jun. 10-15, 2018). "The Case for Learned Index Structures", SIGMOD'18, Houston, TX, US, https://doi.org/10.1145/3183713.3196909.

(Continued)

*Primary Examiner* — Marcin R Filipczyk
(74) *Attorney, Agent, or Firm* — McDonnell Boehnen Hulbert & Berghoff LLP (57) ABSTRACT

Embodiments of the present disclosure provide systems and methods for performing one or more database operations. An exemplary method comprises: receiving, at a transaction manager, a client request to perform one or more database operations with client data, the transaction manager in communication with a database coordinator and a system datastore, sending the client request to the database coordinator to obtain a storage identifier based on the client request; receiving, at the transaction manager, the storage identifier from the database coordinator, sending an operation request to the system datastore, the operation request comprising instructions for the system datastore to perform the one or more database operations using the storage identifier, and receiving an indication of whether the operation request was successfully performed.

17 Claims, 7 Drawing Sheets

(56) References Cited

U.S. PATENT DOCUMENTS

| | | | |
|---|---|---|---|
| 11,341,126 B2 | 5/2022 | Panuganty | |
| 2015/0127628 A1* | 5/2015 | Rathod | G06Q 30/0251 707/710 |
| 2015/0317349 A1* | 11/2015 | Chao | G06F 16/278 707/615 |
| 2015/0347484 A1 | 12/2015 | Klauke | |
| 2016/0117361 A1 | 4/2016 | Boyle | |
| 2017/0109352 A1 | 4/2017 | Aronovich | |
| 2017/0132271 A1* | 5/2017 | Jiao | G06F 12/0261 |
| 2017/0161352 A1* | 6/2017 | Horii | G06F 16/283 |
| 2019/0108248 A1 | 4/2019 | Rajan | |
| 2019/0209022 A1 | 7/2019 | Sobol | |
| 2021/0103838 A1 | 4/2021 | Yuan | |
| 2021/0216520 A1 | 7/2021 | Wang | |
| 2021/0224687 A1 | 7/2021 | Goldszmidt | |
| 2021/0334664 A1 | 10/2021 | Li | |
| 2022/0253419 A1 | 8/2022 | Karlberg | |
| 2023/0049969 A1 | 2/2023 | Bolikowski | |
| 2023/0401230 A1* | 12/2023 | Vissapragada | H04L 67/1095 |

OTHER PUBLICATIONS

U.S. Appl. No. 17/681,569, filed Feb. 25, 2022.
U.S. Appl. No. 18/053,728, filed Nov. 8, 2022.
Office Action, U.S. Appl. No. 18/084,716, mailed Jun. 26, 2023.
Office Action, U.S. Appl. No. 18/053,728, mailed Mar. 16, 2023.
Notice of Allowance, U.S. Appl. No. 18/053,728, mailed Jun. 8, 2023.
Office Action, U.S. Appl. No. 18/084,716, mailed Jan. 30, 2024.

* cited by examiner

MAXIMALLY DISTRIBUTED MINIMALLY COORDINATED SYSTEMS AND METHODS

CROSS-REFERENCE TO RELATED APPLICATIONS

This application claims priority to and the benefit of U.S. Provisional Patent Application No. 63/277,128, filed Nov. 8, 2021, and U.S. Provisional Patent Application No. 63/277,150, filed Nov. 8, 2021, disclosure of which are herein incorporated by reference in their entirety.

FIELD OF DISCLOSURE

The present disclosure relates generally to systems and methods for creating and managing a datastore, and more specifically to systems and methods for improving the efficiency of datastores by providing a system that can accurately store and retrieve data from a datastore in a scalable manner.

BACKGROUND

Recent years have seen an explosion in the production and collection of data. The data collected can produce relatively large and complex datastores that consume a significant amount of storage space. As the volume of data increases, performing various database operations such as storing data and accessing the data to in response to a search query by a user, can result in inefficient or inaccurate storage as well as slow searches that consume processing power. For example, parallel storage systems may be used to store large volumes of data (e.g., petabytes of data) across multiple networked servers. Parallel storage systems can permit access to the data via simultaneous and coordinated input/output operations between clients and storage nodes. However, oftentimes parallel storage systems are not transactional, meaning that these parallel storage systems may not guarantee the integrity of their data.

As another example, transactional storage systems may be used to store and ensure the integrity of its data. The integrity of the data can be maintained by ensuring that each transaction is completed when each operation associated with the transaction is successful, e.g., where a transaction includes one or more operations to read data, write data, modify data, and delete data. For example, if a transaction were to include multiple operations such a read and write operation, the transaction would be completed only if both the read and write operations were successful. That is, if the read operation was successful but the write operation was unsuccessful, both operations would be rolled back to the state before the transaction was attempted. However, transactional storage systems are typically not scalable, i.e., are not suited to managing large volumes of data.

Accordingly, there is a need to create database structures that provide scalable storage for large volumes of data while preserving the integrity of the data.

BRIEF SUMMARY

Embodiments of the present disclosure solve problems associated with performing database operations on large volumes of data while maintaining the integrity of the data. Specifically, embodiments of the present disclosure provide systems and methods to perform database operations efficiently, accurately, and quickly on large volumes of data.

Embodiments of the present disclosure are directed to systems and methods for creating maximally distributed minimally coordinated database operations. Embodiments of the present disclosure may use a transaction manager system in combination with a coordinator system and system datastore to perform enhanced database operations for a large volume of data in a transactional manner. As used herein, the term database operations can refer to one or more operations that can be performed by a database, including but not limited to storing data, retrieving data, and deleting data.

Embodiments according to the present disclosure utilize different types of backing datastores in the following ways: the scalable but non-transactional datastore is used to store petabytes of client-provided data, and the transactional, but non-scalable, datastore is used to store megabytes of identifiers and other lightweight metadata about the objects in the system datastore.

Embodiments of the present disclosure provide systems and methods for performing one or more database operations. An exemplary method can comprise: receiving, at a transaction manager, a client request to perform one or more database operations with client data, the transaction manager in communication with a database coordinator and a system datastore; sending the client request to the database coordinator to obtain a storage identifier based on the client request; receiving, at the transaction manager, the storage identifier from the database coordinator; sending an operation request to the system datastore, the operation request comprising instructions for the system datastore to perform the one or more database operations using the storage identifier; receiving an indication of whether the operation request was successfully performed.

In some embodiments, the storage identifier is a single-use storage identifier. In some embodiments, the database coordinator comprises a transactional datastore. In some embodiments, the system datastore comprises to a non-transactional datastore. In some embodiments, the operation request comprises one or more of a read operation, a write operation, a delete operation, or a combination thereof.

In some embodiments, the operation request comprises the write operation such that performing the one or more database operations comprises writing the client data to the system datastore, and wherein obtaining the storage identifier comprises generating, by the database coordinator, a pending storage identifier corresponding to the storage identifier. In some embodiments, the method further comprises storing, at the database coordinator, the pending storage identifier in temporary storage. In some embodiments, the method further comprises in accordance with receiving an indication that the write operation was successful, sending a finalization request to the database coordinator to store the pending storage identifier in a metadata structure. In some embodiments, the metadata structure comprises one or more of a hash table, a string-oriented key-value store, a distributed Write-Ahead Log (WAL), a petabyte-scale relational database, a virtualized disk or memory management system, a distributed tree structure, a graph data structure, and a distributed data structure. In some embodiments, the method further comprises in accordance with receiving an indication that the write operation was unsuccessful, sending a discard request to the database coordinator to discard the pending storage identifier.

In some embodiments, the operation request comprises the read operation such that performing the one or more database operations comprises retrieving the client data from the system datastore, and wherein obtaining the storage identifier comprises identifying, by the database coordinator, the storage identifier based on the client request, wherein the storage identifier is stored in a metadata structure. In some embodiments, receiving an indication of whether the one or more database operations was successfully completed comprises receiving the client data retrieved from the system datastore. In some embodiments, the method further comprises processing, at the transaction manager, the client data retrieved from the system datastore.

In some embodiments, the operation request comprises the deletion operation such that performing the one or more database operations comprises deleting the client data from the system datastore, and wherein obtaining the storage identifier comprises identifying, by the database coordinator, one or more discarded storage identifiers. In some embodiments, the method further comprises in accordance with receiving an indication that the delete operation was successful, sending a garbage collection request to the database coordinator to delete the one or more discarded storage identifiers corresponding to the successful delete operation.

In some embodiments, the system is configured to perform a plurality of database operations in parallel.

Embodiments of the present disclosure further comprise a datastore system for performing one or more database operations. The system can comprise a memory and one or more processors configured to perform a method. In some embodiments the method comprises: receiving, at a transaction manager, a client request to perform one or more database operations with client data, the transaction manager in communication with a database coordinator and a system datastore; sending the client request to the database coordinator to obtain a storage identifier based on the client request; receiving, at the transaction manager, the storage identifier from the database coordinator; sending an operation request to the system datastore, the operation request comprising instructions for the system datastore to perform the one or more database operations using the storage identifier; receiving an indication of whether the operation request was successfully performed.

In some embodiments, the database coordinator comprises a transactional datastore and the system datastore comprises a non-transactional datastore. In some embodiments, the database coordinator does not directly communicate with the system datastore.

Embodiments of the present disclosure further comprise non-transitory computer-readable storage medium for performing one or more database operations. The non-transitory computer-readable storage medium can store one or more programs, the one or more programs comprising instructions, which when executed by one or more processors of one or more electronic devices, cause the electronic devices to perform. The method can comprise: receiving, at a transaction manager, a client request to perform one or more database operations with client data, the transaction manager in communication with a database coordinator and a system datastore; sending the client request to the database coordinator to obtain a storage identifier based on the client request; receiving, at the transaction manager, the storage identifier from the database coordinator; sending an operation request to the system datastore, the operation request comprising instructions for the system datastore to perform the one or more database operations using the storage identifier; receiving an indication of whether the operation request was successfully performed.

DETAILED DESCRIPTION

Recent years have seen an explosion in the production and collection of data. The data collected can produce relatively large and complex datastores that consume a significant amount of storage space. As the volume of data increases, performing various database operations such as storing data and accessing the data to in response to a search query by a user, can result in inefficient or inaccurate storage as well as slow searches that consume processing power. As discussed above current systems fail to store large volumes of data in an accurate and efficient manner. For example, parallel storage systems may be used to store large volumes of data (e.g., petabytes of data) across multiple networked servers, but oftentimes may not guarantee the integrity of their data (e.g., parallel storage systems are not transactional). As another example, transactional storage systems may be used to store and ensure the integrity of its data, but are not scalable.

Embodiments of the present disclosure address the deficiencies of prior storage systems by solving problems associated with performing database operations on large volumes of data while maintaining the integrity of the data. Specifically, embodiments of the present disclosure provide systems and methods to perform database operations efficiently, accurately, and quickly on large volumes of data. In some instances, embodiments of the present disclosure may be practiced with the U.S. Patent Application entitled "Superindexing Systems and Methods" filed on Nov. 8, 2022 by Era Software, Inc., which is incorporated by reference herein in its entirety.

Embodiments of the present disclosure are directed to systems and methods for creating maximally distributed minimally coordinated database operations. Embodiments of the present disclosure may use a transaction manager system in combination with a transactional coordinator system and a non-transactional system datastore to perform enhanced database operations for a large volume of data in a transactional manner. In this manner, methods in accordance with embodiments of the present disclosure combine the benefits of massively-parallel, fast, and scalable storage systems that can store petabytes of data (that traditionally have the downside of not being transactional), with the benefits of transactional storage systems that can guarantee the integrity of their data (that traditionally have the downside of not being scalable). Methods in accordance with embodiments of the present disclosure use these different types of backing datastores in the following ways: the scalable but non-transactional datastore is used to store petabytes of client-provided data, and the transactional but non-scalable datastore is used to store megabytes of identifiers and other lightweight metadata about the objects in the scalable store.

The following description is presented to enable a person of ordinary skill in the art to make and use the various embodiments. Descriptions of specific devices, techniques, and applications are provided only as examples. Various modifications to the examples described herein will be readily apparent to those of ordinary skill in the art, and the general principles defined herein may be applied to other examples and applications without departing from the spirit and scope of the various embodiments. Thus, the various embodiments are not intended to be limited to the examples described herein and shown, but are to be accorded the scope consistent with the claims.

Although the following description uses terms "first," "second," etc. to describe various elements, these elements should not be limited by the terms. These terms are only used to distinguish one element from another. For example, a first graphical representation could be termed a second graphical representation, and, similarly, a second graphical representation could be termed a first graphical representation, without departing from the scope of the various described embodiments. The first graphical representation and the second graphical representation are both graphical representations, but they are not the same graphical representation.

The terminology used in the description of the various described embodiments herein is for the purpose of describing particular embodiments only and is not intended to be limiting. As used in the description of the various described embodiments and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

The term "if" is, optionally, construed to mean "when" or "upon" or "in response to determining" or "in response to detecting," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]," depending on the context.

Figure 1:
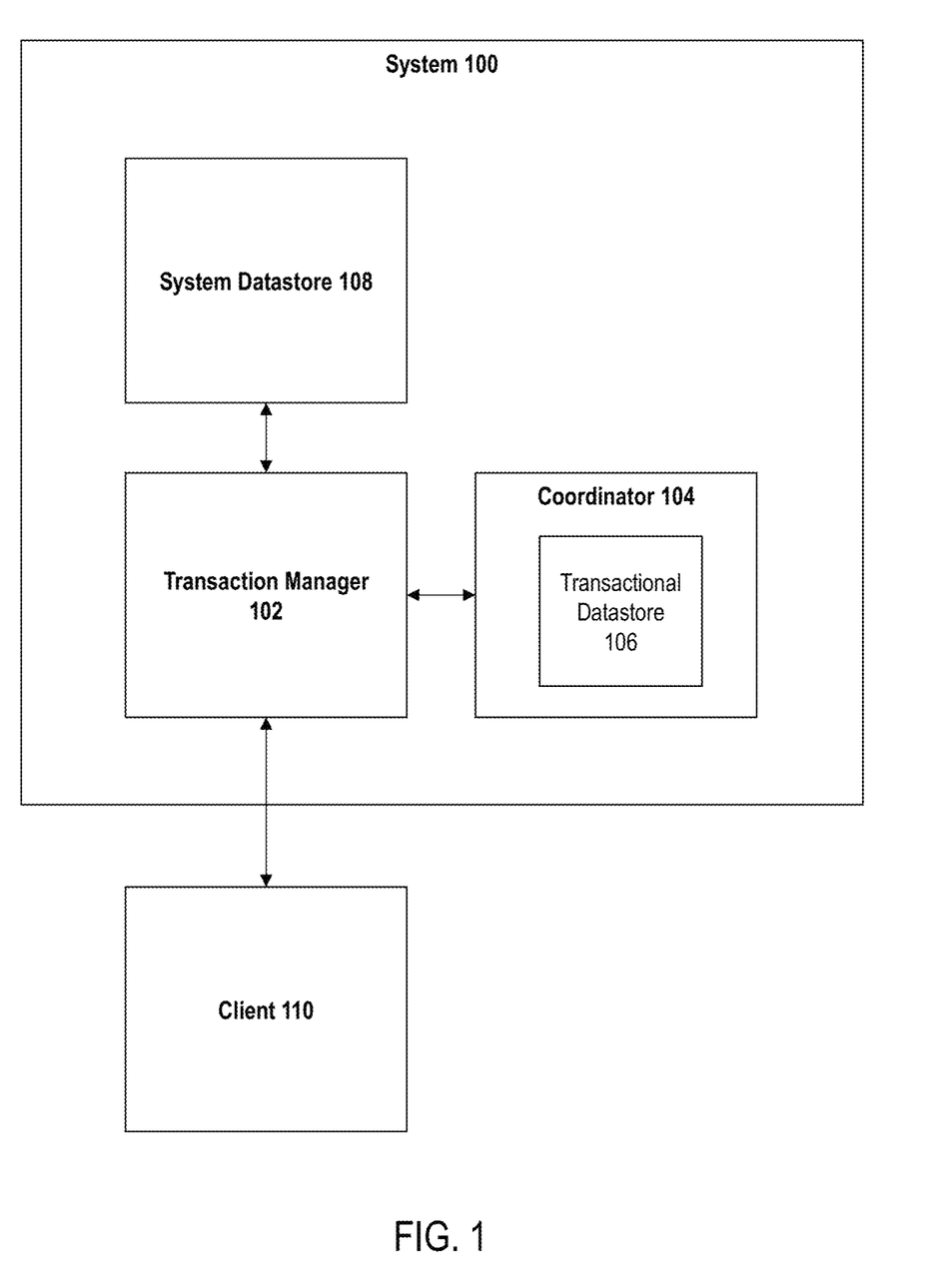
FIG. 1 illustrates an exemplary system, in accordance with some embodiments of this disclosure.

FIG. 1 illustrates an exemplary system 100, in accordance with some embodiments. As shown in the figure, the system 100 may be in communication with a client 110. In some embodiments, the client may include a computing system and/or a display. The system 100 can include a transaction manager 102 in communication with a coordinator 104 and a system datastore 108. In one or more examples, the client 110 may include, but is not limited to other computer systems, administrators, or end-users.

In one or more examples, the transaction manager 102 may be configured to receive a request from the client 110 and communicate with the coordinator 104 and the system datastore 108 based on the request. In one or more examples, the transaction manager 102 may be a stateless transaction manager.

In one or more examples, the coordinator 104 may be configured to communicate with the transaction manager and store metadata regarding client data stored in the system datastore 108. In one or more examples, the coordinator 104 may be transactional but not readily scalable, meaning the coordinator 104 may ensure data integrity, but may not efficiently handle large volumes of data. For example, regarding data integrity, a transaction related to client data stored in the system database 108 may not be finalized unless each database operation associated with the transaction is completed.

In one or more examples, the coordinator 104 may comprise a transactional datastore 106. The coordinator may use the transactional datastore 106 to store small amounts of metadata (e.g., megabytes) about the large amounts of client data (e.g., petabytes) in the system datastore 108. For example, the coordinator 104 may be used to store data relating to identifiers and other lightweight metadata about the client data in the system datastore 108. In some instances, the transactional data store 106 may store metadata including, but not limited to, finalized transactions, pending transactions, and discarded transactions, where each type of transaction may be associated with client data. In one or more examples, the coordinator 104 may be a stateful coordinator that has an initial state stored in the transactional datastore 106. In one or more examples, the transactional datastore may include, but is not limited to PostgreSQL, MySQL, Redis, "etcd," AWS DynamoDB and the like.

In one or more embodiments, the system datastore 108 may store client data received from the client. The system datastore 108 may have an initial state backed by a non-transactional datastore. In one or more examples, the system datastore 108 may be scalable but non-transactional, meaning the system can efficiently handle large volumes of data but may not ensure data integrity. For example, the system datastore 108 may be used to store large volumes (e.g., petabytes) of data but may not require transactional processing when performing database operations on the data. In one or more embodiments, the system datastore 108 may be highly scalable, fast, but also lack accuracy while performing database operations. This lack of accuracy may be inversely correlated with the performance speed of the system datastore 108. In one or more examples, the system datastore 108 may be consistent, non-transactional, and not atomic-consistent-isolated-durable (ACID). In one or more examples, the system datastore 108 may include, but is not limited to, a hash table, a NoSQL database Apache Cassandra, a Bittorrent, the object store Minio, a large distributed array of redundant array of inexpensive disks (RAID), and the like. In one or more examples, the system datastore may have limited transactionability, such as, but not limited to, AWS S3.

System 100 may provide a maximally-distributed-minimally-coordinated database. In one or more examples, the system 100 may be stored across multiple networked servers and/or computing devices. In one or more examples, the system 100 can be configured to receive transaction requests and fulfill those requests via the transaction manager 102, which communicates with the coordinator 104 and the system datastore 108. In one or more examples, the system may be configured to accept a client request and perform a plurality of database operations including, but not limited to read operations, write operations, delete operations, or other operations in any order.

As an example, in one or more embodiments, the transaction manager 102 may receive a query from a client requesting retrieval of data from the system datastore 108. The transaction manager 102 can use the coordinator 104 to transactionally access the data in the system datastore 108, even though the system datastore 108 is not transactional, by wrapping the data stored in system datastore 108 with a transactional coordinator 104. As a result, systems and methods according to the present disclosure combine the benefits of massively-parallel, fast, and scalable storage systems that can store petabytes of data (that traditionally have the downside of not being transactional), with the benefits of transactional storage systems that can guarantee the integrity of their data (that traditionally have the downside of not being scalable).

Write Operations

In one or more embodiments, systems in accordance with embodiment of the present disclosure can handle client requests to write data. In one or more examples, the client request may correspond to a database operation to write data stored in the system datastore (e.g., system datastore 108). For example, the client request may request to store one or more documents in the system datastore 108.

Figure 2A:
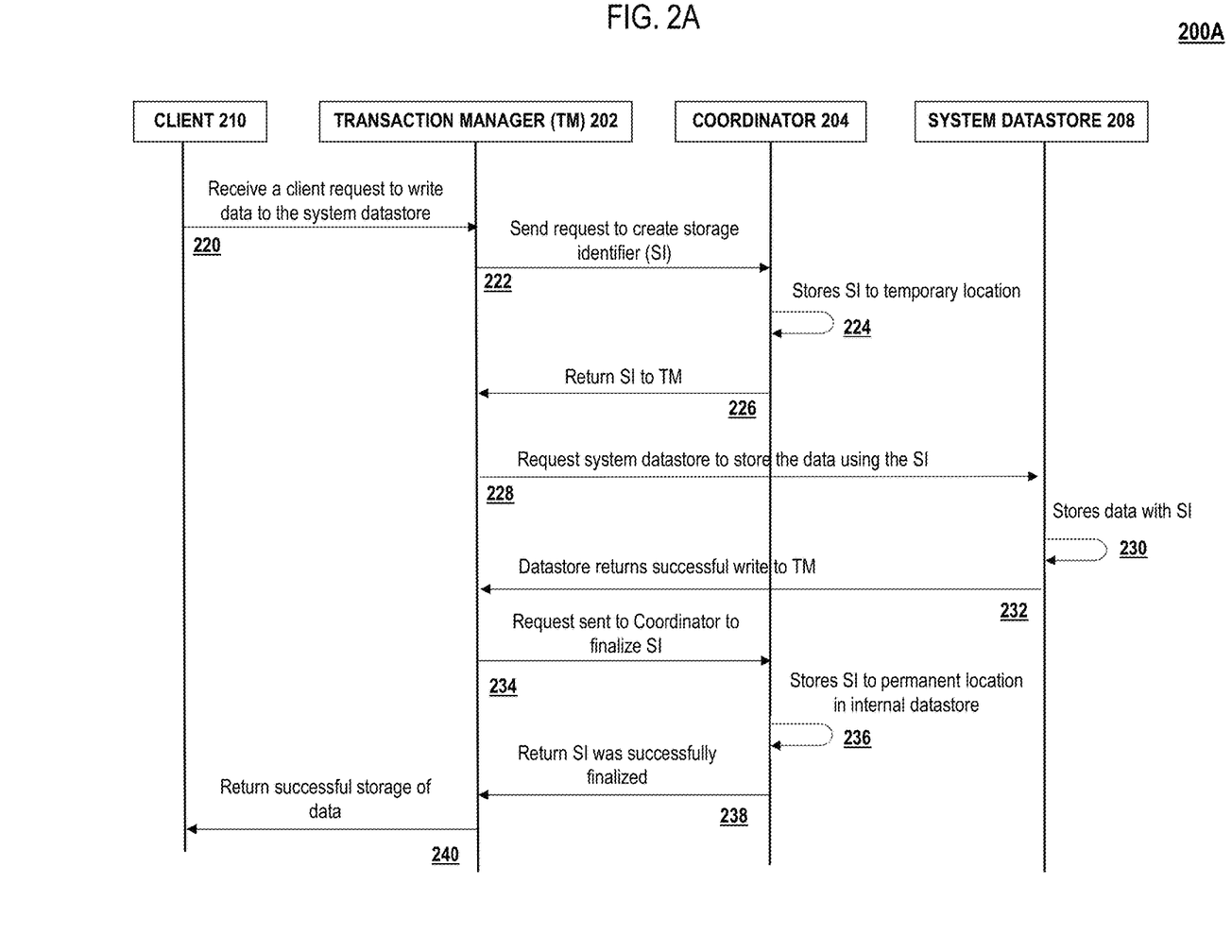
FIG. 2A illustrates an exemplary process for performing a database operation, in accordance with some embodiments of this disclosure.

FIG. 2A illustrates a process 200A for a system (e.g., system 100) handling a client request to read data. As shown in the figure, the process may involve a client 210, a transaction manager 202, a coordinator 204, and a system datastore 208. In one or more examples, the configuration of the system including the transaction manager 202, the coordinator 204, and the system datastore 208 may correspond to FIG. 1. However, a skilled artisan will understand that process 200A is not limited to the configuration of the system 100 of FIG. 1.

Process 200A is performed, for example, using one or more electronic devices implementing a software platform. In some examples, process 200A is performed using a client-server system, and the steps of process 200A are divided up in any manner between the server and a client device. In other examples, the steps of process 200A are divided up between the server and multiple client devices. In other examples, process 200A is performed using only a client device or only multiple client devices. In process 200A, some steps are, optionally, combined, the order of some steps are, optionally, changed, and some steps are, optionally, omitted. In some examples, additional steps may be performed in combination with the process 200A. Accordingly, the operations as illustrated (and described in greater detail below) are exemplary by nature and, as such, should not be viewed as limiting.

At step 220 of FIG. 2A, the system can receive a client request to write data to the system datastore 208. In one or more examples, the transaction manager 202 can receive the request from the client 210 to write data to the system datastore 208. In one or more examples, the request may correspond to a request to transactionally store data to the system datastore 208. For example, the system may receive a request to transactionally store a plurality of documents received from the client.

At step 222 of FIG. 2A, the transaction manger 202 may send a request to the coordinator 204 to create a storage identifier. In one or more examples, the storage identifier may correspond to a single-use identifier. For example, the storage identifier may correspond to any identifier that will not be re-used in the system datastore 208. In some instances, the storage identifier may correspond to auto-incrementing integers or a random string. Referring to the example of the request to store a plurality of documents, separate requests to create a storage identifiers may be repeated for each document, such that each document is associated with a respective storage identifier.

In one or more examples, at step 224 of FIG. 2A, the system may store the storage identifier to a temporary location at the coordinator. For example, the coordinator 204 may store the storage identifier to a temporary location in the transactional datastore (e.g., transactional datastore 106). As another example, the coordinator 204 may store the storage identifier in its internal non-durable memory. Because the storage identifier is temporarily stored in non-durable memory, the pending storage identifier may be lost between server restarts. In one or more examples, at this stage in process 200, the storage identifier may be pending and not committed to or finalized in the transactional datastore.

If the request 222 to the coordinator 204 times out or fails, the transaction manager 202 may issue a cancellation request (not shown) to the coordinator 204 to discard the pending storage identifier. This cancellation request may cancel the pending write request 220 received from the client 210 and may prevent the pending storage identifier from being used for any future database operations requested by the client 210. The storage identifier corresponding to a canceled operation may be discarded by copying the storage identifier to a list of discarded storage identifiers.

In some instances, the transaction manager 202 may automatically time out and not wait for a reply from the coordinator to determine whether the request at step 222 was a success or a failure. For example, after a predetermined amount of time, the transaction manager 202 may automatically issue the cancellation request to discard the pending storage identifier. In one or more examples, once the transaction manager 202 has sent the cancellation request to discard the pending storage identifier, the transaction manager 202 may either re-send the request at step 222 or abort the transaction (e.g., abort the write request 220 from the client).

If the request to the coordinator 204 succeeds (e.g., the coordinator successfully generates the storage identifier), then the transaction manager 202 may receive the pending storage identifier from the coordinator 204 at step 226 of FIG. 2A.

At step 228 of FIG. 2A, the transaction manager 202 may request that the system datastore 208 store the data using the storage identifier. Referring to the example described above, if the client requested that a plurality of documents be stored in the system datastore 208, at step 228, the transaction manager 202 may send a request to the system datastore 208 to store the plurality of documents corresponding to the client request. For example, the system may issue separate requests for each document and its respective storage identifier.

At step 230 of FIG. 2A, the system datastore 208 may attempt to store the data using the storage identifier. If the system datastore 208 is unable to store the data using the storage identifier, then the storage request received at step 228 may fail and/or timeout. The process described with respect to a failure or timeout at step 228 is described in greater detail in FIG. 2B. If the system datastore 208 successfully stores the data at step 230, then transaction manager 202 can receive an indication that the write was successful at step 232 of FIG. 2A.

At step 234 of FIG. 2A, the transaction manager 202 may send a request to the coordinator 204 to finalize the storage identifier.

In one or more examples, the coordinator 204 may not recognize the storage identifier. In such examples, the transaction may be aborted and/or retried from step 222. In some examples, the storage identifier may remain pending, i.e., is still saved to a non-temporary location of the transactional datastore. In some instances, pending storage identifiers may later be discarded (e.g., during garbage collection). In some instances, pending storage identifiers associated with cancelled or aborted transactions may be marked to be discarded, e.g., copied to a list of storage identifiers to be discarded. In embodiments according to the present disclosure discarding the pending storage identifier associated with an aborted transaction is acceptable because the transaction will not be completed. Thus, the system will remain in a correct state, e.g., the discarded storage identifier will not be finalized and may not be used in future operations.

In one or more examples, the coordinator 204 may recognize the storage identifier, but the storage identifier may have already been finalized. This may occur when the transaction manager 202 accidentally sends duplicate requests to the coordinator 204. In such examples, the transaction may be aborted, and the storage identifier may be discarded. The transaction manager 202 may. In such cases, the transaction manager may re-send the request 222 to the coordinator to create a storage identifier. Aborting and/or retrying the duplicated request protects the coordinator 204 from incorrectly acknowledging two finalization requests, as the coordinator should acknowledge one finalization request for each storage identifier, e.g., one identifier should be finalized for each data unit of the client data (e.g., where a data unit may include, but is not limited to, a document, an image, a string, a table and the like).

In one or more examples, if the coordinator 204 recognizes the pending storage identifier and the storage identifier is still pending, then the coordinator 204 can mark the storage identifier as "finalized" in the transactional datastore at step 236. The storage identifier may be finalized by copying the finalized storage identifier into the internal transactional datastore of the coordinator 204. In such embodiments, the finalized storage identifier may be incorporated into the metadata data structures that the coordinator 204 can use to complete future database operations. Accordingly, once the storage identifier is finalized, the storage identifier may subsequently be used by the system for future database operation requests from the client 210.

In one or more examples, the metadata structures can include, but are not limited, to a hash table, a string-oriented key-value store, a distributed Write-Ahead Log (WAL), a petabyte-scale relational database, a virtualized disk or memory management system, a distributed tree or graph data structure, and a distributed data structure.

In some instances, the hash table may include the set of all finalized storage identifiers that are active in the system. For example, the finalized storage identifiers may be stored in the hash table and associated with the respective client data in the transactional datastore (e.g., transactional datastore 106). When processing subsequent requests (e.g., a read request), the transaction manager 202 can request the hash table information from the coordinator 204 to find values in the system datastore 208 for each of the finalized storage identifiers.

In some instances, a string-oriented key-value store, may include keys in the form of user-provided strings, that the coordinator 204 translates to finalized storage identifiers.

For example, the finalized storage identifiers may be stored in the key-value store in the transactional datastore (e.g., transactional datastore 106). The transaction manager 202 can use those finalized storage identifiers to perform database operations (e.g., obtain data) from the system datastore 208.

In some instances, the distributed Write-Ahead Log (WAL), may correspond to a data structure that provides durable ordered message sending and delivery, for messaging or database use cases (similar to, for example, Apache Kafka, or the PostgreSQL database WAL). For example, the transaction manager 202 can receive requests for writing to store a message batch in the system datastore 208 and submit the request to the coordinator 204. The coordinator 204, in turn, can accept the finalized storage identifiers and put the finalized storage identifiers sequentially in an array. When the system receives a request from a client to locate a particular message, the array can be searched to find the message batch containing the finalized storage identifiers of the message id to be located. The system datastore 208 may contain the message blocks, while the coordinator contains the metadata. As a result, methods in accordance with embodiments of the present disclosure enable the creation of a petabyte-scale totally-ordered atomic broadcast system, which allows for building petabyte-scale database systems.

In some instances, the petabyte-scale relational database may be associated with a data structure where schemas and long-running operations are managed by the coordinator 204, query planning is handled by the transaction manager 202, and tables, rows, columns, and indexes are stored in the system datastore 208. In some instances, the virtualized disk or memory management system, may correspond to a data structure where the coordinator 204 stores a mapping from virtual block identifiers to their latest finalized storage identifiers stored in the system datastore 208. This provides a distributed database that is a transactional replacement for local disks, which is especially useful as a drop-in replacement in database systems that internally use page manager APIs (like PostgreSQL).

In some instances, the distributed tree or graph data structure, corresponds to a data structure where finalized storage identifiers may also be referenced by objects in the system datastore 208. In such examples, the root finalized storage identifier may be stored in the coordinator 204, and the child nodes may be stored in the system datastore 208. Each child node references finalized storage identifiers. Thus, using a finalized storage identifier, the transaction manager 202 can retrieve a respective child node from the system datastore 208. Accordingly, embodiments of the present disclosure enable the coordinator 204 to manage the metadata of this "distributed object tree" while offloading the large data size requirements (petabytes or exabytes) to highly-scalable object storage in the system datastore 208.

In some instances, a distributed data structure (like a search tree or LSM tree) corresponds to a data structure in which objects in the system datastore 208 are regularly compacted into more efficient objects. For example, given a system with one-hundred active finalized storage identifiers, a compaction may combine the one-hundred finalized storage identifiers into one finalized storage identifier, and discard the initial 100 finalized storage identifiers (e.g., marking the initial finalized storage identifiers for garbage collection).

At step 238 of FIG. 2A, the transaction manager may receive an indication that the storage identifier was successfully finalized, if the storage identifier is finalized by the coordinator 204. At step 240 of FIG. 2A, the transaction manager may send an indication to the client that the data was successfully stored by the system. In some embodiments, the client may display to a user an indication that the data was successfully stored by the system.

Figure 2B:
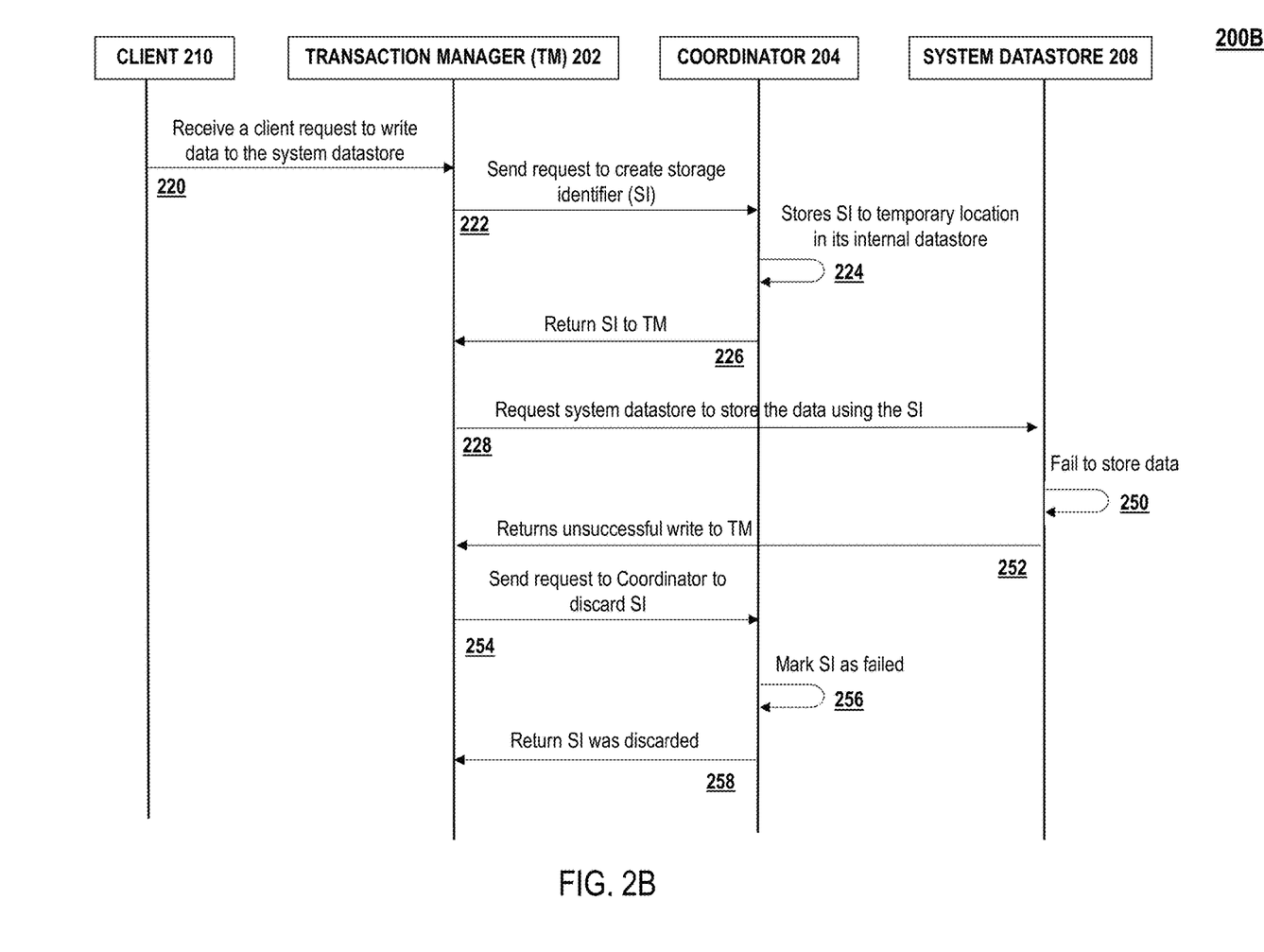
FIG. 2B illustrates an exemplary process for performing a database operation, in accordance with some embodiments of this disclosure.

FIG. 2B illustrates a process 200B for a system (e.g., system 100) handling a client request to read data. Unlike FIG. 2A, which illustrates a successful execution of a client write request, the process 200B illustrates an unsuccessful handling of the client write request. As shown in the figure, the process may involve a client 210, a transaction manager 202, a coordinator 204, and a system datastore 208. In one or more examples, the configuration of the system including the transaction manager 202, the coordinator 204, and the system datastore 208 may correspond to FIG. 1. However, a skilled artisan will understand that process 200B is not limited to the configuration of the system 100 of FIG. 1.

Process 200B is performed, for example, using one or more electronic devices implementing a software platform. In some examples, process 200B is performed using a client-server system, and the steps of process 200B are divided up in any manner between the server and a client device. In other examples, the steps of process 200B are divided up between the server and multiple client devices. In other examples, process 200B is performed using only a client device or only multiple client devices. In process 200B, some steps are, optionally, combined, the order of some steps are, optionally, changed, and some steps are, optionally, omitted. In some examples, additional steps may be performed in combination with the process 200B. Accordingly, the operations as illustrated (and described in greater detail below) are exemplary by nature and, as such, should not be viewed as limiting.

At step 220 of FIG. 2B, the system can receive a client request to write data to the system datastore. In one or more examples, step 220 of FIG. 2B may correspond to step 220 of FIG. 2A. At step 222 of FIG. 2B, the transaction manger may send a request to the coordinator to create a storage identifier. In one or more examples, step 222 of FIG. 2B may correspond to step 222 of FIG. 2A. In one or more examples, at step 224 of FIG. 2A, the system may store the storage identifier to a temporary location. In one or more examples, step 224 of FIG. 2B may correspond to step 224 of FIG. 2A.

If the request to the coordinator 204 succeeds (e.g., the coordinator successfully generates the storage identifier), then the transaction manager 202 may receive the pending storage identifier from the coordinator 204 at step 226 of FIG. 2B. In one or more examples, step 226 of FIG. 2B may correspond to step 226 of FIG. 2A. At step 228 of FIG. 2A, the transaction manager 202 may request that the system datastore 208 store the data using the storage identifier. In one or more examples, step 228 of FIG. 2B may correspond to step 228 of FIG. 2A.

At step 250 of FIG. 2B, the system datastore 208 may unsuccessfully attempt to store the data using the storage identifier. If the system datastore 208 is unable to store the data using the storage identifier, then the write request received at step 228 may fail and/or timeout. In such examples, when the system datastore 208 fails to store the data using the storage identifier, the storage of the data in the system datastore 208 may be in an indeterminant state.

At step 252 of FIG. 2B, the transaction manager 202 may receive an indication that the write request 228 failed or timed out at the system datastore 208. For example, the transaction manager 202 may receive an indication that the data requested to be stored using the storage identifiers is in an indeterminant state. In one or more examples, step 252 may be omitted, for example, write request 228 may automatically timeout after a predetermined amount of time.

At step 254 of FIG. 2B, the transaction manager 202 can send a request to the coordinator 204 to discard the pending storage identifiers associated with the failed data storage requests, e.g., mark the pending storage identifiers as failed. In one or more examples, step 254 may be completed in response to receiving the indication 252 that the write request 228 failed. In some embodiments, step 254 may be completed after the write request 228 times out.

At step 256 of FIG. 2B, the coordinator 204 can mark the appropriate pending storage identifiers as failed. For example, the coordinator 204 can revoke the pending storage identifier and/or mark the pending storage identifier as failed. In some examples, the coordinator may add the storage identifier to a temporary list of objects to be garbage-collected.

At step 258 of FIG. 2B, the coordinator may return that the storage identifier was discarded, e.g., marked as failed to the transaction manager 202. In one or more examples, the transaction manager may either abort the transaction and report the failure status to the client or attempt the client write request again (e.g., returning to step 222). In some examples, the client may display the failure status of the request (e.g., request 220) to a user.

In this manner, embodiments of the present disclosure provide a robust system for ensuring the integrity of data and reducing writing errors in the system datastore 208. By wrapping scalable object storage with a transactional metadata coordinator the resulting system is scalable (e.g., can handle a large volume of data) and transactional (e.g., can maintain the integrity of data). The architecture of this system (e.g., system 100) utilizes the storage identifiers to maintain data integrity for the vast amounts of data stored in the system datastore (e.g., system datastore 108). For example, as shown in described in processes 200A and 200B, pending storage identifiers and/or pending storage identifiers that fail to be associated with a successful database operation are not finalized and may be garbage collected at a later time. Accordingly, only payloads (e.g., client data) that are successfully known to be written to the system datastore 208 will be permitted to be accessed by clients 210 in later requests via finalized storage identifiers.

In this manner, systems and methods in accordance with embodiments of the present disclosure leverage the storage identifiers to solve a problem common among parallel storage systems (e.g., non-transactional systems). As discussed above, non-transactional storage systems such as parallel storage systems lack data integrity, e.g., when the parallel storage system does not return a successful a write request, the parallel storage system may potentially have written a value associated with that write request to a location in the parallel storage system. This can create inconsistencies and inefficiencies when later reading and writing data to the parallel storage system.

For example, in an eventually-consistent datastore (such as, but not limited to, an Apache Cassandra database, an object store like Minio, or a distributed hash table like Chord), a write request is handled by mirroring the write to multiple servers, without synchronization between the servers. These internal write operations in non-transactional datastores may take highly-variable amounts of time to complete, and transient or permanent data loss may occur due to the lack of synchronization. The following is an example behavior trace of a data corruption error that can happen in these systems that embodiments of the present disclosure solve. For example, an exemplary eventually-consistent datastore system may be associated with an operation manager that can dispatch a write request to a parallel storage system. The parallel storage system may thereby cause a write request setting A=0 to be made to three internal replica servers, two of which reply with a succeed response. Because there is no synchronization between the replica servers (e.g., because the parallel storage system is not transactional), the operation manager knows that two out of three servers succeeded and the operation manager can report that the operation succeeded.

Later, the name A is re-used, to set A=1, and the three replica servers are contacted as before. The same two servers succeed and the same server fails. Once again and the operation manager may report a success. However, because the parallel storage system is eventually consistent (non-transactional), the first set of write requests setting A=0 may still exist internally. For example, the first set of write requests may have been issued using UDP packets, and were duplicated and delayed in network transmission buffers during the first set of write requests, without the knowledge of the Transaction Manager. As a result, the duplicated and delayed packets setting A=0 may execute after A=1 was executed. In this example, the value of A may be reverted to 0. This occurs without the knowledge of the Transaction Manager. Thus, the value A=1 has been irretrievably lost, by a silent data corruption. More generally, values of variables in an eventually-consistent parallel storage system may revert to any past value.

Methods according to this disclosure may use single-use identifiers to prevent these scenarios in the following instances: (1) the transaction manager learns of a storage identifier from the Coordinator, and writes that storage identifier to the system datastore. The transaction manager may retry the write request when the value assigned to the storage identifier is the same. (2) The transaction manager learns from the coordinator that it should request an storage identifier from the system datastore and sends a request to the system datastore to read the value of the storage identifier: (A) if the system datastore replies with a value, then that value should be correct and up-to-date, because the storage identifier corresponds to a single-use value; (B) if the system datastore is unable to reply with a value, then the transaction manager knows that the value was written in the past, but is currently inaccessible. This is because the transaction manager obtained the storage identifier from the coordinator, which, as a transactional system, guarantees the validity of the storage identifier. As a result, the transaction manager will not indicate that, for example, a value was deleted when in fact the value is transiently unavailable. In this manner, embodiments of the present disclosure wrap eventually consistent storage systems (e.g., system datastore) with a transactional coordinator, thereby imparting transactional behavior to the data stored in the system (e.g., system 100).

As a result, methods in accordance with embodiments of the present disclosure combine the benefits of massively-parallel, fast, and scalable storage systems that can store petabytes of data (that traditionally have the downside of not being transactional), with the benefits of transactional storage systems that can guarantee the integrity of their data (that traditionally have the downside of not being scalable). System 100 uses these different types of backing datastores in the following ways: the scalable but non-transactional datastore is used to store petabytes of client-provided data and the transactional but non-scalable datastore is used to store megabytes of identifiers and other lightweight metadata about the objects in the scalable store. In one or more examples, the coordinator can be backed by relational databases like PostgreSQL or MySQL, or by transactional NoSQL systems such as Redis or AWS DynamoDB. In one or more examples, the system datastore can be backed by scalable but non-transactional systems like the NoSQL database Apache Cassandra, the object store Minio, or a large globally-distributed array of RAID disks. These examples of relational/transactional systems and non-transactional systems are merely exemplary and others may be used in relation to systems disclosed herein without departing from the scope of this disclosure.

Read Operations

Embodiments of the present disclosure provide systems and methods for performing a plurality of database operations. In one or more examples, the transaction manager can handle client requests to read data. In one or more examples, the client request may read metadata stored in the internal datastore (e.g., internal datastore 106) of the coordinator (e.g., coordinator 104) and/or data stored in the system datastore (e.g., system datastore 108).

Figure 3:
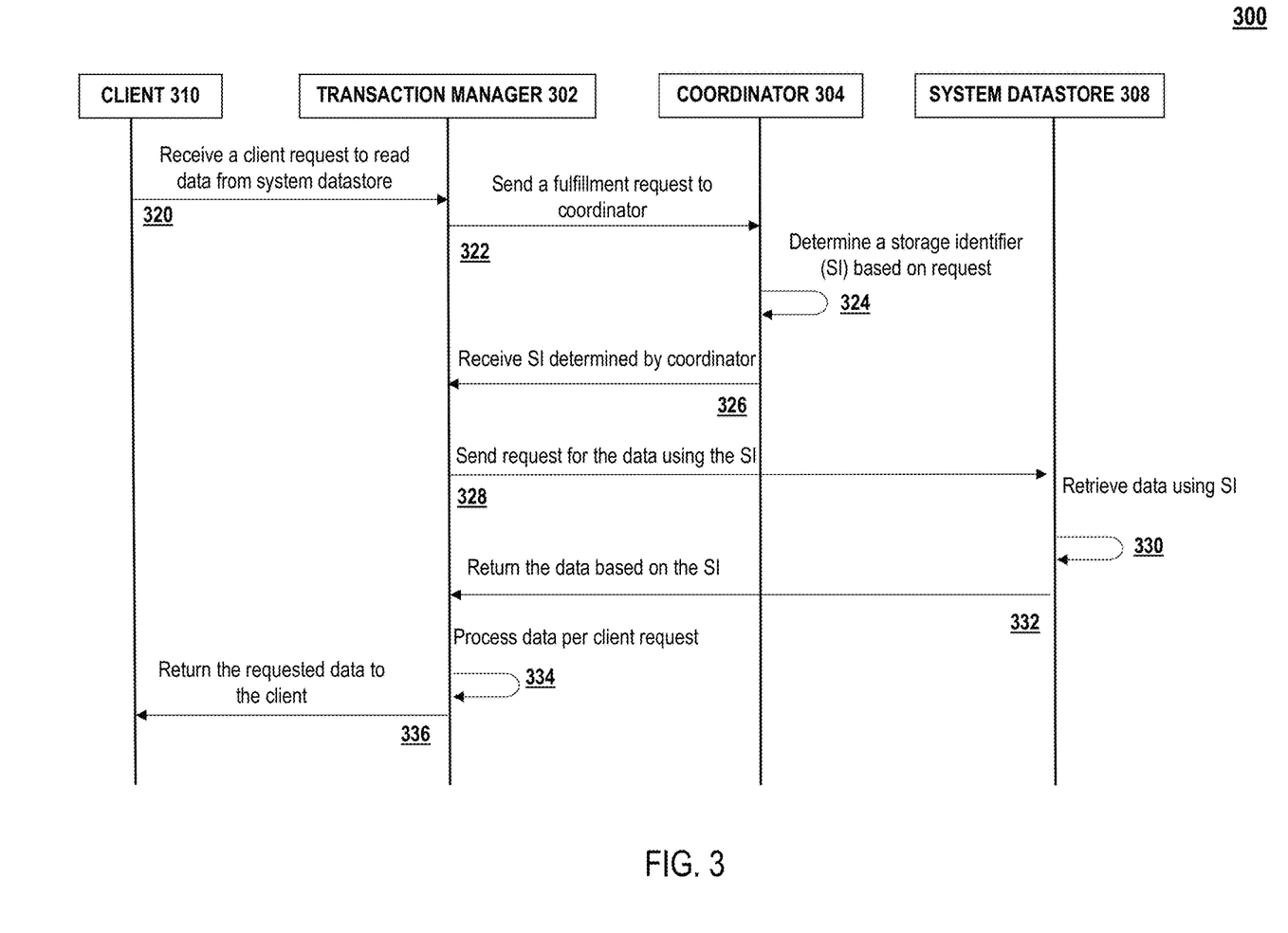
FIG. 3 illustrates an exemplary process for performing a database operation, in accordance with some embodiments of this disclosure.

FIG. 3 illustrates a process 300 for a transaction manager handling a client request to read data. As shown in the figure, the process may involve a client 310, a transaction manager 302, a coordinator 304, and a system datastore 308. In one or more examples, the configuration of the system including the transaction manager 302, the coordinator 304, and the system datastore 308 may correspond to system 100 of FIG. 1. However, a skilled artisan will understand that process 300 is not limited to the configuration of the system 100.

Process 300 is performed, for example, using one or more electronic devices implementing a software platform. In some examples, process 300 is performed using a client-server system, and the steps of process 300 are divided up in any manner between the server and a client device. In other examples, the steps of process 300 are divided up between the server and multiple client devices. In other examples, process 300 is performed using only a client device or only multiple client devices. In process 300, some steps are, optionally, combined, the order of some steps are, optionally, changed, and some steps are, optionally, omitted. In some examples, additional steps may be performed in combination with the process 300. Accordingly, the operations as illustrated (and described in greater detail below) are exemplary by nature and, as such, should not be viewed as limiting.

At step 320 of FIG. 3, the transaction manager 302 can receive a client request from the client 310 to read data from the system data. In one or more examples, the request can be directed to reading data stored in system datastore 308. For example, the client 210 may request to read one or more documents stored in datastore 308. In one or more examples the request may involve reading metadata stored at the coordinator 304 (e.g., in transactional datastore of the coordinator 304). In one or more examples, the request may be a query to read data in the datastore 308 that has certain attributes, e.g., read documents from the datastore that are written by a particular author.

At step 322 of FIG. 3, the transaction manager 302 can send a fulfillment request to the coordinator 304 to complete the client request. In one or more examples, the fulfillment request may correspond to the client request at step 320. In one or more examples, the transaction manager 302 may repackage the client request to generate the fulfillment request. For example the transaction manager 302 may repackage the client request received at 320 to request one or more storage identifiers associated with the requested data.

At step 324, the coordinator 304 may identify a storage identifier based on the fulfillment request. In one or more examples, the coordinator 304 may identify the storage identifier by leveraging the metadata structures associated with the data stored in the system datastore 308 (e.g., metadata stored in the transactional datastore). Exemplary metadata structures may include, but are not limited to a hash table, a string-oriented key-value store, a distributed Write-Ahead Log (WAL), a petabyte-scale relational database, a virtualized disk or memory management system, a distributed tree or graph data structure, and a distributed data structure, as described above. For example, based on the requested read data, the coordinator 304 may be able to identify the corresponding storage identifier using the metadata structure, as described above.

At step 326 of FIG. 3, the transaction manager 302 can receive, from the coordinator 304, the storage identifier determined at step 324. At step 328 of FIG. 3, the transaction manager 302 can request the data, from the system datastore 308, using the storage identifier determined by the coordinator 304. At step 330 of FIG. 3, the system datastore 308 can obtain the data requested in step 328. For example, the system datastore 308 may use the storage identifier to locate and retrieve the requested data.

At step 332, the transaction manager 302 can receive the data retrieved from the system datastore 308. At step 334 of FIG. 3, the transaction manager 302 can process the data received from the system datastore 308 based on the client request. For example, if the request 320 corresponds to a query, the transaction manager 302 can process the data received from the system datastore 308 and discard data that does not meet the parameters of the query. For example, if the query asks for documents written by a particular author before a specified date, the transaction manager 302 can ensure that each document retrieved by the system datastore 308 meets both parameters. At step 336 of FIG. 3, the system 300 can return the requested data to the client 310. Referring to the previous example, the system 300 can return documents to the client 310 that were written by a particular author before a specified date. In some examples, the documents may be displayed to a user, e.g., a user who initiated the request 320.

In one or more examples, the transaction manager 302 can individual requests to the coordinator 304 and system datastore 308 for each data unit (e.g., document, image, string, etc.). For example, if a client request relates to multiple data units, the transaction manager 302 can send multiple sequential requests to the coordinator 304 for finalized storage identifiers and send multiple sequential requests to the system datastore 308 for the data corresponding to the finalized storage identifiers. In one or more examples, these multiple sequential requests may enable the transaction manager 302 to execute a distributed tree traversal over a distributed object tree stored in the system datastore 308 (e.g., where a finalized storage identifier names each node in the tree).

Accordingly, embodiments of the present disclosure provide methods to read data efficiently, quickly, and transactionally, by wrapping scalable object storage with a transactional metadata coordinator.

Garbage Collection Operations

In one or more embodiments, the transaction manager can handle requests to run garbage collection. Partial failures of client requests can lead to the accumulation of garbage data. For example, when write requests to the system datastore fail, the data may still exist on one or more hard disk drives in the system datastore (e.g., because the system datastore is non-transactional). Additionally, the discarded storage identifiers may exist in the transactional datastore. Garbage collection, as used herein may refer to removal of discarded storage identifiers (e.g., associated with failed write operations) and/or the corresponding data (e.g., data stored in the system datastore). That is, garbage collection allows the system to empty space in the transactional datastore (e.g., transactional datastore 106) and system datastore (e.g., system datastore 108) in the event that a client request fails. In one or more examples, the transaction manager may receive a client request to run garbage collection. In one or more examples, the transaction manager may periodically run garbage collection.

Figure 4:
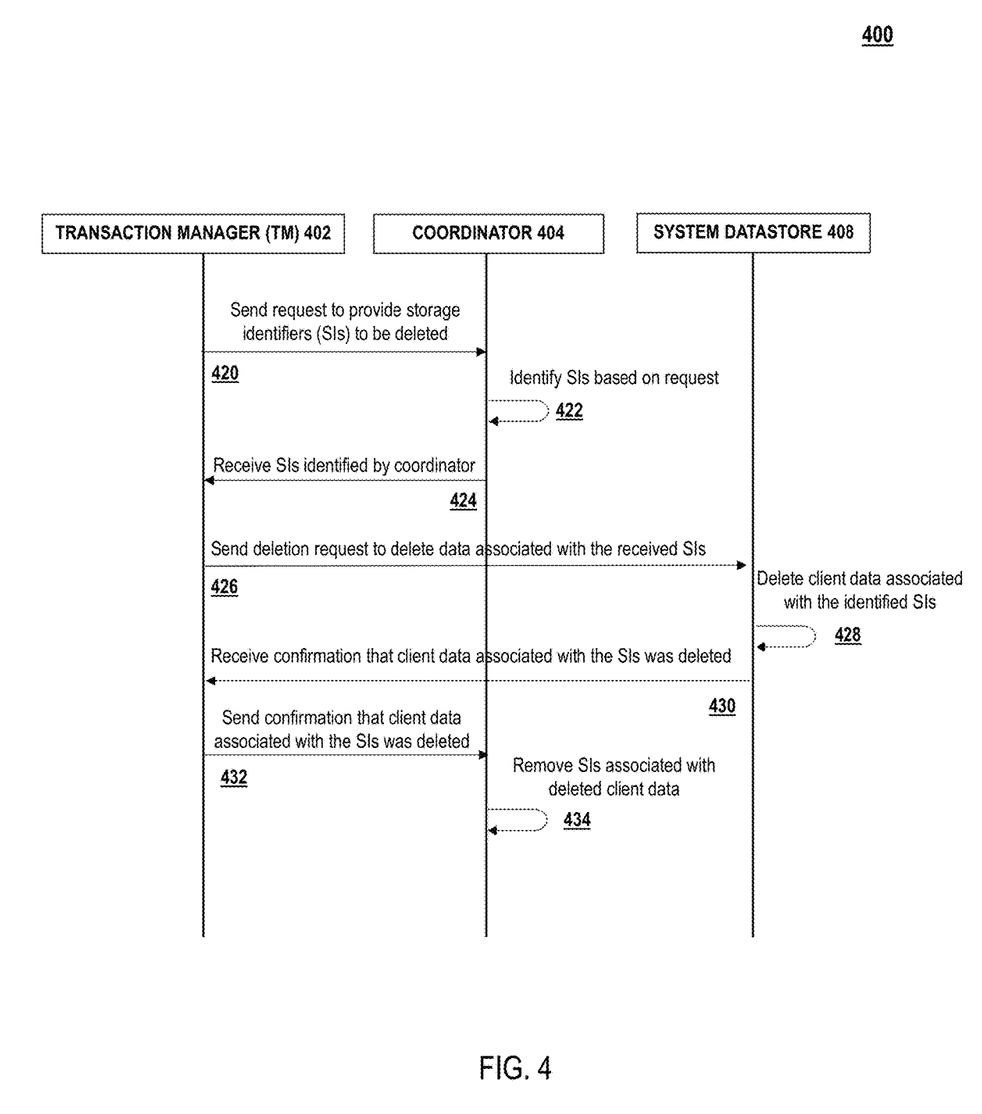
FIG. 4 illustrates an exemplary process for performing a database operation, in accordance with some embodiments of this disclosure.

FIG. 4 illustrates an exemplary process 400 for performing one or more garbage collection operations. Process 400 is performed, for example, using one or more electronic devices implementing a software platform. In some examples, process 400 is performed using a client-server system, and the steps of process 400 are divided up in any manner between the server and a client device. In other examples, the steps of process 400 are divided up between the server and multiple client devices. In other examples, process 400 is performed using only a client device or only multiple client devices. In process 400, some steps are, optionally, combined, the order of some steps are, optionally, changed, and some steps are, optionally, omitted. In some examples, additional steps may be performed in combination with the process 400. Accordingly, the operations as illustrated (and described in greater detail below) are exemplary by nature and, as such, should not be viewed as limiting.

At step 420 of FIG. 4, the transaction manager 402 can send a request to the coordinator 404 to provide a set of storage identifiers to be deleted.

At step 422 of FIG. 4, the coordinator 404 may identify the set of storage identifiers to be deleted based on the request. In one or more examples, the coordinator 404 may identify the set of storage identifiers to be deleted based on a set of discarded storage identifiers. As described above, the discarded storage identifiers may correspond to storage identifiers associated with failed client requests (e.g., when a coordinator fails to generate a storage identifiers, when a system datastore fails to write data, when a coordinator fails to finalize the storage identifier, etc.). In one or more examples, the set of discarded storage identifiers may be stored in temporary storage in the transactional datastore of the coordinator 404 (e.g., transactional datastore 106). In one or more examples, the set of discarded storage identifiers is not stored in the metadata structure, e.g., because the discarded storage identifiers are not finalized, e.g., as described with respect to FIG. 2B.

At step 424 of FIG. 4, the transaction manager 402 can receive the set of storage identifiers identified by the coordinator 404. At step 426 of FIG. 4, the transaction manager 402 can send a request to the system datastore 408 to delete data associated with the received storage identifiers. In one or more examples, the transaction manager 402 may issue a separate deletion request for each of the received storage identifiers.

At step 428 of FIG. 4, the system datastore 408 may delete the data associated with the storage identifier included in the request sent at step 426. At step 430 of FIG. 4, the transaction manager 402 may receive an indication that the deletion at step 428 was successful. At step 432 of FIG. 4, the transaction manager 402 can send a confirmation to the coordinator 404 that the data associated with the previously identified storage identifier was deleted. At step 434 of FIG.

4, the coordinator can delete the storage identifier from the set of discarded storage identifiers in the transactional datastore of coordinator 404. In one or more embodiments, steps 424-434 may be repeated until each of the storage identifiers identified at step 422 and the data corresponding to these storage identifiers are deleted.

In one or more examples, storage identifiers can also be intentionally deleted, such as when a distributed database compaction occurs, whereby old objects are deleted and replaced with newer objects. For example, during distributed database compaction, initial data stored in the database may be merged to create new data (e.g., two identical documents may be merged). In such examples, the coordinator may track the initial set of storage identifiers associated with the new data and generate a new storage identifier corresponding to the new data. The coordinator 404 may track the initial storage identifiers and identify these storage identifiers at step 422 discussed above, such that the initial data (e.g., unmerged documents) can be deleted to free up space in the system datastore 408.

In one or more examples, embodiments of the present disclosure can perform the processes described above quickly (e.g., hundreds, thousands, or millions of times per second). In one or more examples, the rate at which the processes described above are executed may be based on the rate at which the clients are requesting the database operations. In one or more examples, the multiple database operations associated with multiple clients may be run in parallel.

Figure 5:
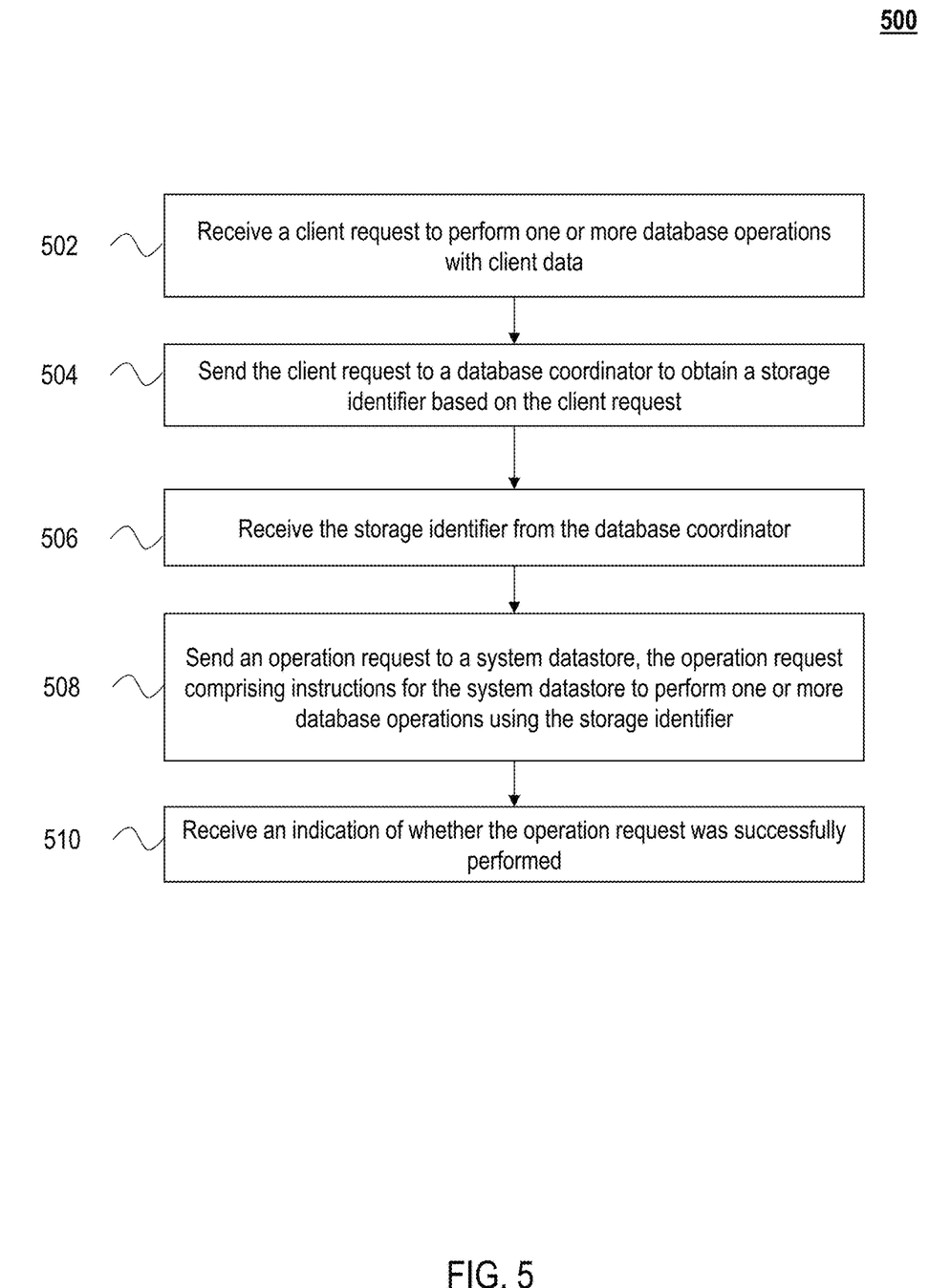
FIG. 5 illustrates an exemplary process for performing a database operation, in accordance with some embodiments of this disclosure.

FIG. 5 illustrates a general process 500 for performing one or more database operations according to embodiments of the present disclosure. Process 500 is performed, for example, using one or more electronic devices implementing a software platform. In some examples, process 500 is performed using a client-server system, and the steps of process 500 are divided up in any manner between the server and a client device. In other examples, the steps of process 500 are divided up between the server and multiple client devices. In other examples, process 500 is performed using only a client device or only multiple client devices. In process 500, some steps are, optionally, combined, the order of some steps are, optionally, changed, and some steps are, optionally, omitted. In some examples, additional steps may be performed in combination with the process 500. Accordingly, the operations as illustrated (and described in greater detail below) are exemplary by nature and, as such, should not be viewed as limiting.

At block 502 of FIG. 5, the system can receive a client request to perform one or more database operations with client data. For example, the transaction manager can receive a client request. In one or more examples, block 502 may correspond to steps 220 and/or 320 described above.

At block 504 of FIG. 5, the system can send the client request to a database coordinator to obtain a storage identifier. For example, the transaction manager (e.g., transaction manager 102) can send the client request to the coordinator (e.g., coordinator 104). In one or more examples, block 504 may correspond to steps 222, 322, and/or 420 described above.

At block 506 of FIG. 5, the system can receive the storage identifier from the database coordinator. For example, the transaction manager (e.g., transaction manager 102) can receive the storage identifier from the coordinator (e.g., coordinator 104). In one or more examples, block 506 may correspond to steps 226, 326, and/or 424 described above.

At block 508 of FIG. 5, the system can send an operation request to a system datastore, where the operation request may include instructions for the system datastore to perform one or more database operations using the storage identifier. For example, the transaction manager (e.g., transaction manager 102) can send an operation request to the system datastore (e.g., system datastore 108) to perform one or more of a read operation, a write operation, a delete operation, and the like. In one or more examples, block 508 may correspond to steps 228, 328, and/or 426 described above.

At block 510 of FIG. 5, the system can receive an indication of whether the operation request was successfully performed. For example, the transaction manager (e.g., transaction manager 102) can receive an indication from the system datastore (e.g., system datastore 108) indicative of whether the one or more database operations (e.g., a read operation, a write operation, a delete operation, and the like) was successfully performed. In one or more examples, block 510 may correspond to steps 238, 258, 332, and/or 430 described above.

Figure 6:
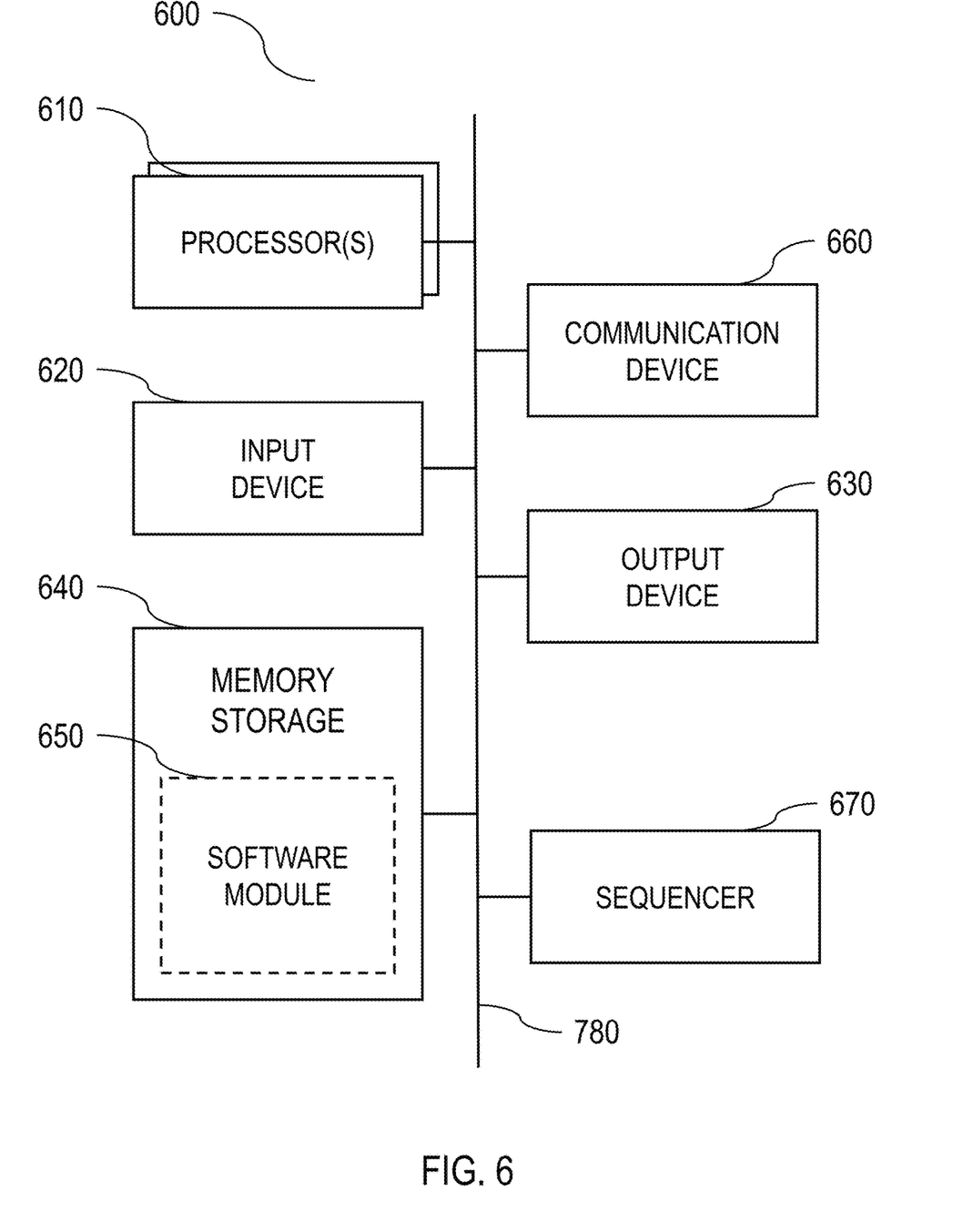
FIG. 6 illustrates an exemplary electronic device, in accordance with embodiments of this disclosure.

The operations described above with reference to the preceding figures are optionally implemented by components depicted in FIG. 6. It would be clear to a person having ordinary skill in the art how other processes are implemented based on the components depicted in FIG. 6.

FIG. 6 illustrates an example of a computing device in accordance with one embodiment. Device 600 can be a host computer connected to a network. Device 600 can be a client computer or a server. As shown in FIG. 6, device 600 can be any suitable type of microprocessor-based device, such as a personal computer, workstation, server or handheld computing device (portable electronic device) such as a phone or tablet. The device can include, for example, one or more of processor 610, input device 620, output device 630, storage 640, and communication device 660. Input device 620 and output device 630 can generally correspond to those described above, and can either be connectable or integrated with the computer.

Input device 620 can be any suitable device that provides input, such as a touch screen, keyboard or keypad, mouse, or voice-recognition device. Output device 630 can be any suitable device that provides output, such as a touch screen, haptics device, or speaker.

Storage 640 can be any suitable device that provides storage, such as an electrical, magnetic or optical memory including a RAM, cache, hard drive, or removable storage disk. Communication device 660 can include any suitable device capable of transmitting and receiving signals over a network, such as a network interface chip or device. The components of the computer can be connected in any suitable manner, such as via a physical bus or wirelessly.

Software 650, which can be stored in storage 640 and executed by processor 610, can include, for example, the programming that embodies the functionality of the present disclosure (e.g., as embodied in the devices as described above).

Software 650 can also be stored and/or transported within any non-transitory computer-readable storage medium for use by or in connection with an instruction execution system, apparatus, or device, such as those described above, that can fetch instructions associated with the software from the instruction execution system, apparatus, or device and execute the instructions. In the context of this disclosure, a computer-readable storage medium can be any medium, such as storage 640, that can contain or store programming for use by or in connection with an instruction execution system, apparatus, or device.

Software 650 can also be propagated within any transport medium for use by or in connection with an instruction execution system, apparatus, or device, such as those described above, that can fetch instructions associated with the software from the instruction execution system, apparatus, or device and execute the instructions. In the context of this disclosure, a transport medium can be any medium that can communicate, propagate or transport programming for use by or in connection with an instruction execution system, apparatus, or device. The transport readable medium can include, but is not limited to, an electronic, magnetic, optical, electromagnetic or infrared wired or wireless propagation medium.

Device 600 may be connected to a network, which can be any suitable type of interconnected communication system. The network can implement any suitable communications protocol and can be secured by any suitable security protocol. The network can comprise network links of any suitable arrangement that can implement the transmission and reception of network signals, such as wireless network connections, T1 or T3 lines, cable networks, DSL, or telephone lines.

Device 600 can implement any operating system suitable for operating on the network. Software 650 can be written in any suitable programming language, such as C, C++, Java or Python. In various embodiments, application software embodying the functionality of the present disclosure can be deployed in different configurations, such as in a client/server arrangement or through a Web browser as a Web-based application or Web service, for example.

Although the disclosure and examples have been fully described with reference to the accompanying figures, it is to be noted that various changes and modifications will become apparent to those skilled in the art. Such changes and modifications are to be understood as being included within the scope of the disclosure and examples as defined by the claims.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the techniques and their practical applications. Others skilled in the art are thereby enabled to best utilize the techniques and various embodiments with various modifications as are suited to the particular use contemplated.

The invention claimed is:

1. A method for performing one or more database operations, the method comprising:
   receiving, at a transaction manager, a client request to perform the one or more database operations with client data, the transaction manager in communication with a database coordinator having a transactional datastore that stores a metadata structure, and a system datastore including the client data;
   sending the client request to the database coordinator to obtain a single-use storage identifier based on the client request, wherein the single-use storage identifier is stored in an internal non-durable memory;
   receiving, at the transaction manager, the single-use storage identifier from the database coordinator, wherein the metadata structure is configured as a distributed Write-Ahead Log (WAL) to store the single-use storage identifier, and wherein the single-use storage identifier is specified in the metadata structure as a pending storage identifier;
   storing, at the database coordinator, the pending storage identifier in temporary storage;
   sending, from the transaction manager in receipt of the single-use storage identifier, an operation request to the system datastore, the operation request comprising instructions for the system datastore to perform the one or more database operations using the single-use storage identifier including a write operation for writing the client data to the system datastore; and
   receiving an indication of whether the operation request was successfully performed.

2. The method of claim 1, wherein the system datastore comprises a non-transactional datastore.

3. The method of claim 1, further comprising, in accordance with receiving an indication that the write operation was successful, sending a finalization request to the database coordinator to store the single-use storage identifier in permanent storage.

4. The method of claim 1, further comprising, in accordance with receiving an indication that the write operation was unsuccessful, sending a discard request to the database coordinator to discard the single-use storage identifier.

5. The method of claim 1, wherein the operation request also comprises a read operation such that performing the one or more database operations comprises retrieving the client data from the system datastore, wherein obtaining the single-use storage identifier comprises identifying, by the database coordinator, the single-use storage identifier based on the client request.

6. The method of claim 5, wherein receiving the indication of whether the one or more database operations was successfully completed comprises receiving the client data retrieved from the system datastore.

7. The method of claim 5, further comprising processing, at the transaction manager, the client data retrieved from the system datastore.

8. The method of claim 1, wherein the operation request comprises a deletion operation such that performing the one or more database operations comprises deleting the client data from the system datastore.

9. The method of claim 8, wherein obtaining the single-use storage identifier comprises identifying, by the database coordinator, one or more discarded storage identifiers, the method further comprising, in accordance with receiving an indication that the delete operation was successful, sending a garbage collection request to the database coordinator to delete the one or more discarded storage identifiers corresponding to the delete operation.

10. The method of claim 1, wherein the system datastore is configured to perform a plurality of database operations in parallel.

11. A datastore system, the datastore system comprising:
   a memory; and
   one or more hardware processors configured to perform a method comprising:
      receiving, at a transaction manager, a client request to perform one or more database operations with client data, the transaction manager in communication with a database coordinator having a transactional datastore that stores a metadata structure, and a system datastore including the client data;
      sending the client request to the database coordinator to obtain a single-use storage identifier based on the client request, wherein the single-use storage identifier is stored in an internal non-durable memory;
      receiving, at the transaction manager, the single-use storage identifier from the database coordinator, wherein the metadata structure is configured as a distributed Write-Ahead Log (WAL) to store the single-use storage identifier, and wherein the single-use storage identifier is specified in the metadata structure as a pending storage identifier;

storing, at the database coordinator, the pending storage identifier in temporary storage;

sending, from the transaction manager in receipt of the single-use storage identifier, an operation request to the system datastore, the operation request comprising instructions for the system datastore to perform the one or more database operations using the single-use storage identifier including a write operation for writing the client data to the system datastore; and receiving an indication of whether the operation request was successfully performed.

12. The datastore system of claim 11, wherein the system datastore comprises a non-transactional datastore.

13. The datastore system of claim 11, wherein the database coordinator does not directly communicate with the system datastore.

14. The datastore system of claim 11, further comprising, in accordance with receiving an indication that the write operation was successful, sending a finalization request to the database coordinator to store the single-use storage identifier in permanent storage.

15. The datastore system of claim 11, further comprising, in accordance with receiving an indication that the write operation was unsuccessful, sending a discard request to the database coordinator to discard the single-use storage identifier.

16. The datastore system of claim 11, wherein the operation request comprises a deletion operation such that performing the one or more database operations comprises deleting the client data from the system datastore.

17. A non-transitory computer-readable storage medium storing one or more programs, the one or more programs comprising instructions, which when executed by one or more processors of one or more electronic devices, cause the electronic devices to perform a method comprising:

receiving, at a transaction manager, a client request to perform one or more database operations with client data, the transaction manager in communication with a database coordinator having a transactional datastore that stores a metadata structure, and a system datastore including the client data;

sending the client request to the database coordinator to obtain a single-use storage identifier based on the client request, wherein the single-use storage identifier is stored in an internal non-durable memory;

receiving, at the transaction manager, the single-use storage identifier from the database coordinator, wherein the metadata structure is configured as a distributed Write—Ahead Log (WAL) to store the single-use storage identifier, and wherein the single-use storage identifier is specified in the metadata structure as a pending storage identifier;

storing, at the database coordinator, the pending storage identifier in temporary storage;

sending, from the transaction manager in receipt of the single-use storage identifier, an operation request to the system datastore, the operation request comprising further instructions for the system datastore to perform the one or more database operations using the single-use storage identifier including a write operation for writing the client data to the system datastore; and receiving an indication of whether the operation request was successfully performed.

* * * * *